(12) United States Patent
Hwu et al.

(10) Patent No.: US 6,219,187 B1
(45) Date of Patent: *Apr. 17, 2001

(54) LASER BEAM COUPLER SHAPER AND COLLIMATOR

(75) Inventors: Ruey-Jennifer Hwu; XuDong Wang, both of Salt Lake City, UT (US)

(73) Assignee: University of Utah, Salt Lake City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/430,759

(22) Filed: Oct. 29, 1999

Related U.S. Application Data

(63) Continuation of application No. 08/990,375, filed on Dec. 15, 1997, now Pat. No. 5,995,289.

(51) Int. Cl.$^7$ ................................................ G02B 27/10
(52) U.S. Cl. .............................................. 359/627; 626/618
(58) Field of Search .................................. 359/627, 618, 359/626

(56) References Cited

U.S. PATENT DOCUMENTS

| | | | |
|---|---|---|---|
| 3,290,539 | 12/1966 | Lamorte | 313/114 |
| 4,477,730 | 10/1984 | Fukuda et al. | 250/504 |
| 4,716,568 | 12/1987 | Scifres et al. | 372/36 |
| 5,040,187 | 8/1991 | Karpinski | 372/50 |
| 5,128,951 | 7/1992 | Karpinski | 372/50 |
| 5,166,755 | 11/1992 | Gat | 356/419 |
| 5,222,088 | 6/1993 | Amano | 372/22 |
| 5,284,790 | 2/1994 | Karpinski | 437/129 |
| 5,311,530 | 5/1994 | Wagner et al. | 372/36 |
| 5,311,535 | 5/1994 | Karpinski | 372/50 |
| 5,325,384 | 6/1994 | Herb et al. | 372/36 |
| 5,333,077 | 7/1994 | Legar et al. | 359/619 |
| 5,526,373 | 6/1996 | Karpinski | 372/101 |
| 5,572,542 | 11/1996 | Dixon | 372/92 |
| 5,574,740 | 11/1996 | Hargis et al. | 372/41 |
| 5,576,752 | 11/1996 | Kovacs et al. | 347/238 |
| 5,594,591 | 1/1997 | Yamamoto et al. | 349/5 |
| 5,610,759 | 3/1997 | Delacourt et al. | 359/328 |
| 5,610,934 | 3/1997 | Zarrabi | 372/70 |
| 5,615,042 | 3/1997 | Delacourt et al. | 359/338 |
| 5,627,850 | 5/1997 | Irwin et al. | 372/43 |
| 5,631,918 | 5/1997 | Kovacs et al. | 372/36 |
| 5,644,584 | 7/1997 | Nam et al. | 372/20 |
| 5,668,825 | 9/1997 | Karpinski | 372/101 |
| 5,907,404 | 5/1999 | Marron et al. | 356/360 |
| 5,995,289 | 11/1999 | Hwu et al. | 359/627 |

OTHER PUBLICATIONS

W.A. Clarkson and D.C. Hanna, "Two–Mirro Beam–Shaping Technique for High–Power Diode Bars," Optics Letters, vol. 21, No. 6, pp. 375–377, Mar. 15, 1996.

*Primary Examiner*—Georgia Epps
*Assistant Examiner*—Michael A Lucas
(74) *Attorney, Agent, or Firm*—Workman, Nydegger & Seeley

(57) ABSTRACT

An apparatus for providing improved high power laser beams. An elongated reflector with a highly-reflective inner surface is utilized with a laser beam emitter, such as a broad area diode laser, a diode laser bar, or a diode laser array. The laser beams disperse and reflect off of the highly-reflective inner surface which is curved substantially parabolically. The inner surface is coated with a highly reflective material such as aluminum or nickel. The reflected beams are collimated, and can be shaped and/or coupled by manipulation of the size and shape of the elongated reflector and the placement of the laser beam emitter in association therewith. A system of lenses and/or mirrors in conjunction with a non-linear crystal can also be utilized with the present invention.

20 Claims, 5 Drawing Sheets

LASER BEAM COUPLER SHAPER AND COLLIMATOR

This application is a continuation of U.S. application Ser. No. 08/990,375, filed Dec. 15, 1997 now U.S. Pat. No. 5,995,289.

BACKGROUND OF THE INVENTION

1. The Field of the Invention

The present invention is directed generally to apparatus for improving laser technology. More specifically, the present invention is related to apparatus for improving the quality of semiconductor diode lasers, broad area diode lasers, diode laser bars, and diode laser arrays.

2. The Relevant Technology

A laser is a device which utilizes the transitions between energy levels of atoms or molecules to amplify or generate light. When an electron makes a transition from a higher energy level to a lower energy level, a photon, the elementary quantity of radiant energy, is emitted. In what is referred to as "stimulated emission," an incoming photon stimulates an electron to change energy levels, which amplifies the number of exiting photons. In fact, this is the origin of the term laser: light amplification by the stimulated emission of radiation. The emitted photon travels in the same direction and is in the same phase as the incoming photon. When the stimulated emission in a laser involves only a single pair of energy levels, the resultant output beam has a single frequency or wavelength and is thus approximately monochromatic.

One example of a conventional laser is the semiconductor laser diode. Semiconductor lasers are particularly useful for several reasons: they are capable of generating coherent radiation in the wavelength range which is particularly useful for optical fiber communications; they are relatively easy to fabricate and less costly than conventional, larger gas lasers; and they have a compact size which is useful in many applications including optical fiber communications, printing, and medical treatments.

One example of a conventional semiconductor laser is a broad area laser diode. The "broad area" refers to the junction plane from whence the laser radiation originates. Most broad area semiconductor lasers comprise a "stripe" geometry. The stripe geometry typically has dimensions of about 5 to 30 $\mu$m in width, about 0.1 mm in length, and about 1 $\mu$m in thickness. There are several advantages with respect to this geometry. First, there is improved response time due to small junction capacitance. Further, the thin active layer which is the area wherein the laser radiation is generated and confined, contributes to a smaller cross sectional area. This reduces the operating current, which is necessary for sustained operation of the laser, and also reduces the threshold current, which is the current required to induce a laser device to commence lasing action.

However, the laws of diffraction dictate that beam divergence, which is not desirable, will greatly increase with decreasing aperture size. Yet, most applications require a small beam with maximum power in the smallest area possible. Increasing the width of the aperture does not help, because not only does it reduce the power per area of the emitted beam, it has been demonstrated that the modal characteristics are significantly degraded as the aperture width is increased past a certain point. As this width is increased, the mode degrades from a single, good quality Guassian intensity profile, to several filaments of the beam spread over a large area.

Another example of a semiconductor laser is a laser diode bar. Attempts have been made to increase the power with respect to these semiconductor lasers by combining multiple laser diodes into what is termed a "laser array." The advantage of placing individual laser diodes into an array is that the overall output power can be increased by phase locking several diode lasers together such that they operate as a single source. Yet, even though the power does increase when multiple lasers are combined to produce multiple beams, the quality is extremely poor. In turn, users are forced to spend increased time and money in attempting to alleviate the poor laser quality of the laser arrays, with less than ideal results.

In addition, achieving the desired mode control and coherence from arrays has proved difficult. As a result, virtually all the high-power arrays commercially available emit their radiation into two broad far-field lobes instead of a single diffraction-limited lobe.

Over the last decade there has been a tremendous amount of research effort spent in designing and fabricating high power arrays with adequate modal control and degree of coherence. Commercially available diode laser arrays have been available for the last few years which utilize stacked configurations of bars of laser diodes which lie in the grooves of a planar substrate containing a heat sink for the device. These stacked diode bars use a technology which is built upon "rack and stack" configurations. See, e.g., U.S. Pat. Nos. 5,311,535 and No. 5,526,373 by Karpinski, both of which are incorporated herein by reference.

Yet, the use of diode laser bars in this stacked design has many disadvantages. For example, this stacked design is inflexible and limited to a planar configuration. In addition, each diode laser bar, typically including more than twenty individual laser diodes, is pumped as an integral unit and individual laser diodes cannot be pumped or replaced separately. If even one diode laser inside the laser bar is damaged, the entire bar must be replaced. Unfortunately, replacement of one laser diode array containing only one diode laser bar is expensive.

Furthermore, the emitted laser beams from laser diode arrays experience significant divergence. This problem is addressed in U.S. Pat. Nos. 5,311,535 and No. 5,668,825 by Karpinski, the disclosures of which are incorporated herein by reference. Specifically, individual lenses are placed at a predetermined distance with respect to each diode laser. The radiation emitted from each diode laser passes through a lens which collimates the laser beam. Such a system requires the fabrication of multiple microlenses and the accurate placement of each, which complicates the manufacturing process thereby raising the overall cost of the system. Furthermore, any misalignments in the placement of the lenses greatly reduces the efficiency of the system, yet adjustments in alignment are extremely difficult. This system at its best is able to convert electrical power into optical power at an efficiency of about 50%.

U.S. Pat. No. 5,333,077, by Legar, the disclosure of which is incorporated herein by reference, suggests an alternative solution to the problem of the diverging emission which comprises a combination of aperture filling and geometrical transformation, and requires two optical elements. The first optical element is a linear array of lenses, each of which receives and redirects a different portion of the emission from the diode array. The second optical element is a separate two-dimensional array of lenses located at the imaginary plane and aligned with the two-dimensional pattern of light beams thereby redirecting and focusing the two dimensional pattern of light beams to the focal point. The second array of lenses can be placed in a rectangular or a hexagonal close packed geometrical pattern. The lenses in both arrays are diffractive lenses.

Although the efficiency could in theory approach approximately 99%, the fabrication of these diffractive lens arrays with the appropriate profiles is difficult, time consuming, and costly. This is due in particular to the complex mask and etch technique commonly used in integrated circuit fabrication. Masks must be made and etching must be done at each step. For a lens of m levels, there must be P master masks made and P etching steps performed, where $m=2^P$. In addition to the fabrication constraints, the alignment of the microlens arrays must be very precise with respect to each other and with respect to the diode array.

SUMMARY AND OBJECTS OF THE INVENTION

It is therefore a feature of the present invention to provide small and inexpensive high power lasers with improved laser beam quality.

It is still another object of the present invention to provide control of the divergence of laser beams from broad area diode lasers, laser diode bars, and laser diode arrays.

Another object of the present invention is to provide improved apparatus for collimating, coupling and shaping laser beams.

Yet another object of the present invention is to provide improved diode pumped solid state laser systems and harmonic generation laser systems such as green, blue, and ultraviolet light.

These and other objects and features of the present invention will become more fully apparent from the following description and appended claims, or may be learned by the practice of the invention as set forth hereinafter.

To achieve the foregoing objects, and in accordance with the invention as embodied and broadly described herein, the present invention relates to a new and useful apparatus for improving the beam quality of high power lasers and particularly broad area diode lasers, laser diode bars, and laser diode arrays.

Specifically, the present invention is directed to an apparatus for collimating, shaping and/or coupling laser beams emitted from diode laser arrays. The beam coupler feature allows the output of multiple diode lasers to be focused to a small spot with a relatively small beam divergence.

The preferred design of the apparatus of the present invention is an elongated reflector with a highly-reflective inner surface. Each cross section of the highly-reflective inner surface comprises a substantially paraboloid curvature. The paraboloid curvature defines a line of focal points which extends along the length of the elongated reflector thus forming a focal line. In a preferred embodiment, a laser beam emitter is positioned with respect to the elongated reflector such that the laser beam emitter extends along the focal line. In alternate embodiments of the invention, the laser beam emitter extends above or below the focal line. The laser beam emitter comprises broad area laser diodes, diode laser bars, or laser diode arrays. The laser beam emitter is advantageously positioned such that the laser beams impact with and reflect off of the highly-reflective inner surface. Further, by adjusting the size and shape of the reflector, the size and shape of the laser beams can be manipulated. Placement of external lenses, mirrors, and non-linear crystals also serves to manipulate the laser beams.

In the case of broad area diode lasers, the laser beam emitter is placed at a focal point of a two-dimensional paraboloid. Alternatively, a one-dimensional paraboloid is utilized in conjunction with a lens for collimating the laser beam in the second dimension.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered limiting of its scope, the invention in its presently understood best mode for making and using the same will be described and explained with additional specificity and detail through the use of the accompanying drawings in which.

DETAILED DESCRIPTION OF THE INVENTION

Figure 1:
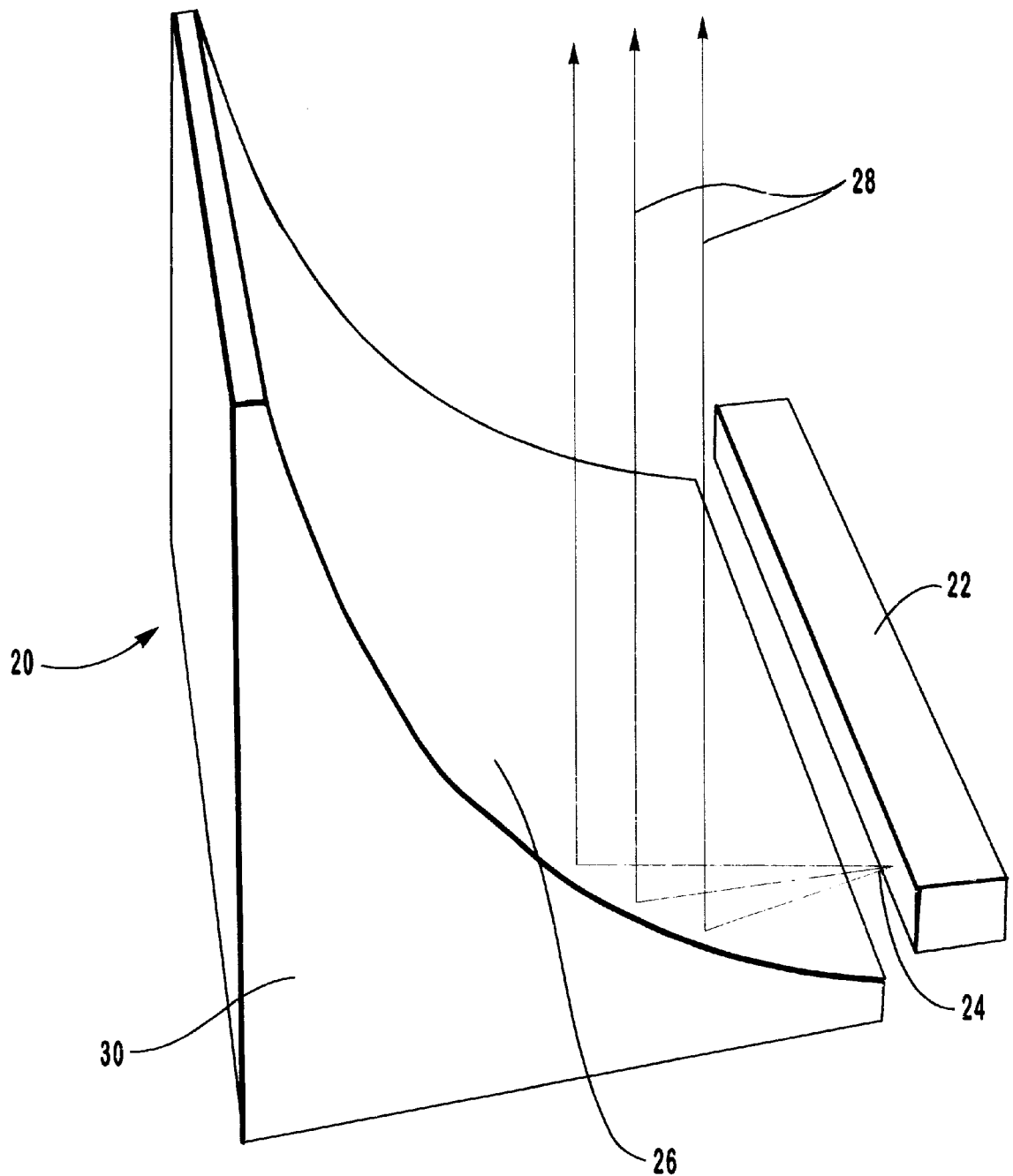
FIG. 1 is a schematic perspective view of one embodiment of the present invention.

High power continuous wave and quasi continuous wave diode bars have become increasingly attractive as the pump source for high power solid-state lasers due to their relative low cost and wide commercial availability. However, the conventional laser beam output from these high power diode bars is highly elliptical, which has rendered the devices difficult to use efficiently in end-pumped configurations. In turn, complex resonator designs are conventionally necessary with end-pumped configurations utilizing the conventional high power diode bars.

Further, both broad area lasers and high-power diode laser bars have the property of fast divergence that makes it very difficult to collimate the light coming out from these lasers through the use of ordinary collimating techniques.

In addition, conventional laser diode arrays have required expensive and complex manufacturing processes to accurately secure multiple microlenses or to fabricate special diffractive lens arrays to diminish beam divergence. Still, these arrays have resulted in less than optimal power and beam quality.

In contrast, the present invention incorporates a unique design that allows the output of multiple laser diode bars to be focused to a small spot with minimal beam divergence suitable for end pumping solid state lasers. The unique design of the present invention provides high power laser beams with significantly improved beam quality while decreasing the cost and complexity of the system. In addition, the present invention is especially suitable for quasi continuous wave diode laser bars. Further, the present invention eliminates entirely the spherical aberration associated with conventional optics used to collimate diode laser beams.

The collimating technique of the present invention is used to collect most of the light and parallelize the fast divergent light coming out from high-power diode lasers, such as broad-area lasers and diode laser bars. By applying this collimating technique, the efficiency of high-power diode laser systems can be improved dramatically. The collimating technique of the present invention is also capable of collimating and beam shaping that are required for improving the efficiency of diode-pumped solid-state lasers.

A preferred embodiment of the present invention comprises an elongated reflector working in concert with a laser beam emitter element. A plurality of emitted laser beams reflect off the inner surface of the elongated reflector, which in turn significantly increases the efficiency and the amount of usable power of the lasers beams. Specifically, it is a feature of the present invention that the conventional beam divergence is redirected such that the beams are collimated, coupled, and/or shaped as they exit the reflector.

Collimating of the output beams occurs when the beams are reflected off the inner surface of the elongated reflector in a parallel arrangement with respect to each other. Coupling occurs when the output of multiple individual diode lasers or even multiple individual diode laser bars is directed to a small region. Shaping the output beams is accomplished by changing the dimensions of the elongated reflector.

FIG. 1 is a perspective view of an elongated reflector 20 and laser beam emitter 22 in accordance with the present invention. The elongated reflector 20 is preferably sized according to the needs of the end user or the application for which the laser is being utilized. In a preferred embodiment of the present invention, the reflector is about 1 cm thick, about 3 cm long, and about 3 cm wide.

It should be appreciated that very small devices such as those in the range of a few microns are preferred for applications requiring efficient, high power laser beams on a tiny scale. One example of such a small scale application is in the ophthalnic field. Alternatively it should be appreciated that much larger scale applications are envisioned by the apparatus and method of the present invention, and may require reflectors in the range of a few meters in size.

The elongated reflector preferably comprises machined steel, but is in no way limited to such material. It should be appreciated that other materials would be equally suitable for the present invention.

The elongated reflector 20 has a smooth inner surface 26 which is preferably highly reflective. In the preferred embodiment of the present invention, the inner surface is coated with a reflective coating of aluminum. It has been demonstrated that aluminum yields a reflectivity of about 92%. A preferred thickness for the aluminum reflective coating is from about 100 nm to about 3 $\mu$m. It should be appreciated that thicker coatings exhibit better surface characteristics, but are also more costly and time consuming than less thick coatings.

In an alternate embodiment of the present invention, the reflective coating comprises a layer of nickel which yields a reflectivity of 97%. It should be appreciated in accordance with the invention described herein, that other reflective coatings could be alternatively or additionally utilized to facilitate the reflectivity of the inner surface of the parabolic cavity. Alternatively, the inner surface of the parabolic cavity itself may be uncoated but highly polished to effectuate an appropriate reflectivity.

Figure 2:
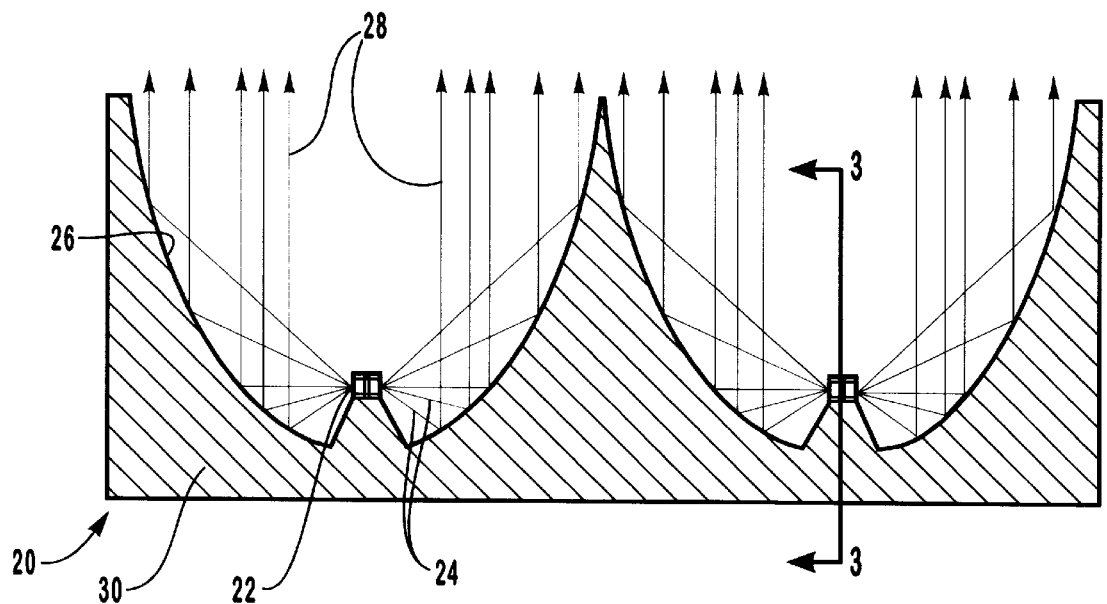
FIG. 2 is a cross-sectional view of an alternative embodiment of the present invention.

In a preferred embodiment of the present invention, the inner surface 26 is curved such that in cross section the curvature resembles one side of a parabola. FIG. 2, for example, illustrates four elongated reflectors in cross section, each of which resembles half, or one side, of a parabola, and is thus referred to herein as "hemi-parabolic." It will be appreciated by inspection of FIG. 2 that two elongated reflectors can be situated such that in cross section, the reflectors complete a fill parabola. Alternatively, the reflectors can be used individually or separated by some distance such that only one side or a portion of the parabola is represented.

Further, each cross section of the parabolically curved inner surface has a corresponding focal point defined generally by the equation, $f=x^2/4y$. In the preferred embodiment of the present invention, the elongated reflector includes a focal line comprising each cross-sectional focal point extending the length of the elongated reflector in a single plane.

The steepness or slope of the curvature of the inner surface is varied according to the preference of the end user and the application for which it will be used. For example, the steeper the slope of the curvature cavity, the more narrow the width of the exiting laser beams. A more flattened slope results in a much larger width of the exiting laser beams.

In addition, the precise placement of the laser beam emitter within the elongated reflector effectuates different beam characteristics. It is an important feature of the present invention that the laser beam emitter is positioned in a single plane with respect to the elongated reflector. This single plane is designed by reference to the focal line of the parabolic inner surface.

Figure 4:
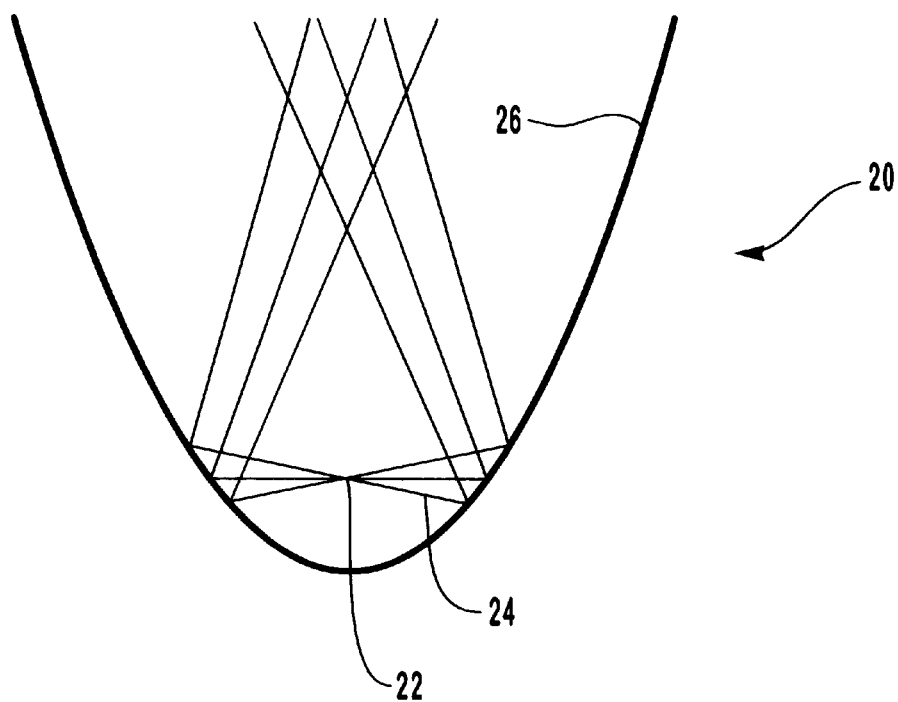
FIG. 4 is a schematic view of another embodiment of the present invention.
Figure 5:
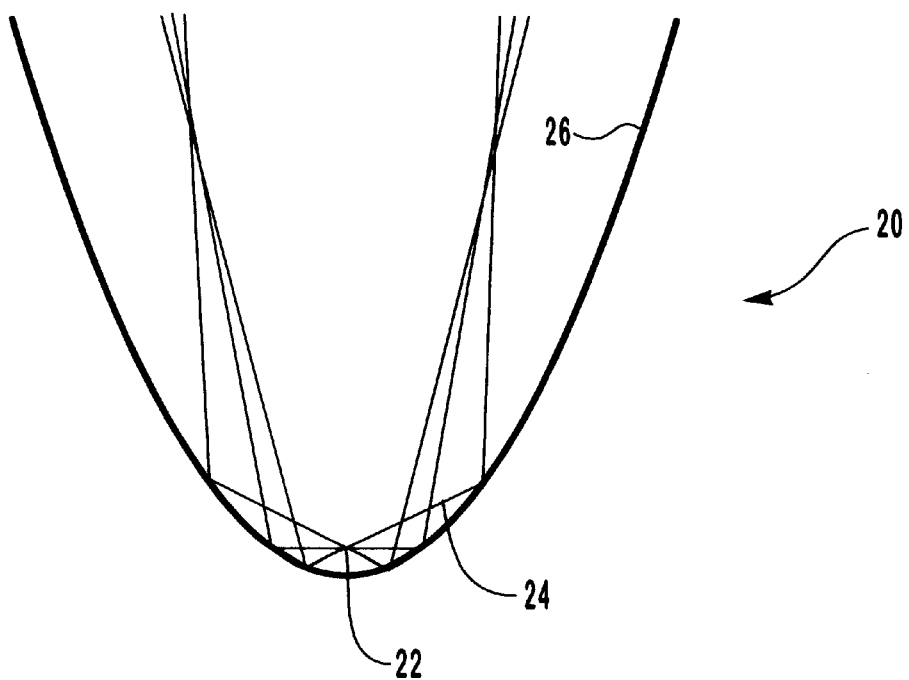
FIG. 5 is a schematic view of yet another embodiment of the present invention.

For example, in a preferred embodiment of the present invention depicted in FIG. 1, the laser beam emitter 22 is positioned such that the laser beams 24 are emitted at the focal line of the parabolic inner surface. The resulting beams 28 exiting the elongated reflector are collimated as illustrated in FIG. 2. Alternatively, different beam configurations are achieved when the laser beam emitter is positioned above the focal line as illustrated in FIG. 4, or beneath the focal line of the reflector as illustrated in FIG. 5.

In an alternate embodiment of the present invention, a lens is positioned just beyond the elongated reflector to focus the beams exiting the reflector.

As illustrated in FIG. 1, the laser beam emitter 22 preferably has a plurality of laser beam outputs such as in the form of broad area diode lasers, diode laser bar, or laser diode arrays.

A preferred diode laser bar has a width of about 1 cm. A plurality of diode bars is commonly referred to as a diode array. The present invention is directed to unique arrangements for diode laser arrays, and is not limited to the end-pumping and planar configuration of commercially available laser diode arrays. To the contrary, the present invention envisions the use of side pumping and flexible designs. Further, higher power is achieved by stacking the diode laser bars on top of each other to form two dimensional diode laser arrays.

In a preferred embodiment of the present invention, the diode bar includes a semiconductor laser such as those comprising gallium indium phosphide. In an alternate embodiment of the present invention, the diode bar comprises gallium arsenide antimonide semiconductor lasers. It will be appreciated by those of skill in the art that the diode laser may comprise virtually any combination of semiconductor compounds conventionally utilized in diode laser applications.

Figure 3:
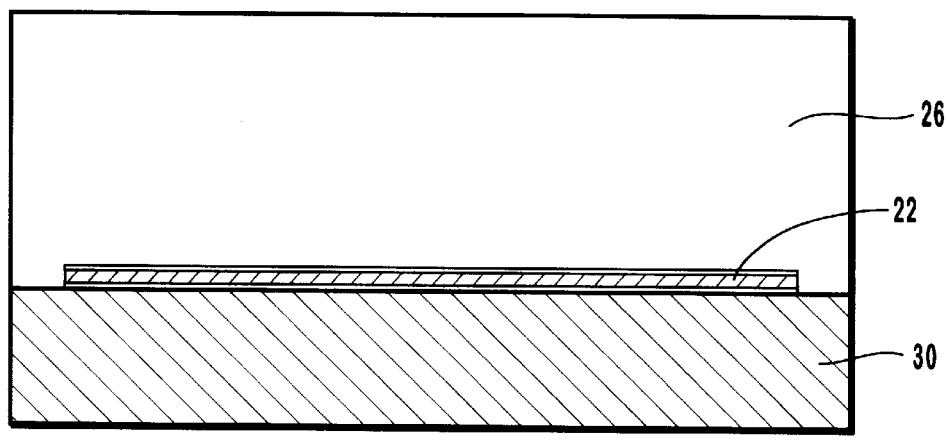
FIG. 3 is a cross-sectional view of the embodiment of FIG. 2 taken along line 3—3.

An alternate embodiment of the present invention comprises a laser beam emitter in the form of a broad area diode laser. A preferred broad area laser diode is about 800 μm in length, and the aperture or face of the diode bar is about 1am in height by 100 μm in width. FIG. 3 illustrates the narrow aperture of the broad area laser diode in cross section through line 3—3 of FIG. 2. Individual broad area diode lasers can be placed along a focal line of a one dimension paraboloid reflector to form a diode laser bar of individual diodes. This configuration advantageously features individual diode pumping and replacement.

Preferably, the wavelength of each broad area laser diode or laser diode bar is about 810 nanometers. Alternatively, a wavelength of 980 nanometers is utilized. However, the present invention is in no way limited to either wavelength. By way of example only and not limitation, the present invention envisions wavelengths from infrared to the ultraviolet.

In a preferred embodiment of the present invention, the output of each broad area diode laser is from about 100 milliwatts to several watts. Alternatively, when the diode laser bars are combined into diode laser arrays, beam powers from about 20 watts to about 100 watts and higher can be achieved. Further, when the arrays are utilized in accordance with present invention as will be described in more detail hereinbelow, the resulting power achieved can be on the order of thousands of watts for diode-pumped solid state lasers, or even tens of thousands of watts for diode-pumped fusion lasers. Further in quasi continuous wave operation, significantly higher peak power is achieved.

The generation of such high power also generates significant amounts of heat. Therefore, as illustrated in FIGS. 1 and 2, the present invention preferably includes a heat sink 30 which surrounds the laser beam emitter, and absorbs and dissipates the excess heat generated by operation of the laser beam emitter. In addition, the heat sink functions as a base for the apparatus of the present invention as a whole as illustrated in FIGS. 1 and 2. In a preferred embodiment of the present invention, the heat sink comprises a copper block. In an alternate embodiment of the present invention, beryllium oxide is utilized between layers of copper as an additional heat dissipator.

As should be appreciated by inspection of FIGS. 1 and 2, the heat sink forms the external material surrounding the inner surface 26.

It should also be appreciated by inspection of FIG. 1 that more than one elongated reflector and laser beam emitter combination can be utilized at one time. For example, in FIG. 2, four reflectors are depicted immediately adjacent one another. It should be understood that the present invention envisions other configurations when multiple reflectors are used in conjunction with one another.

Figure 6:
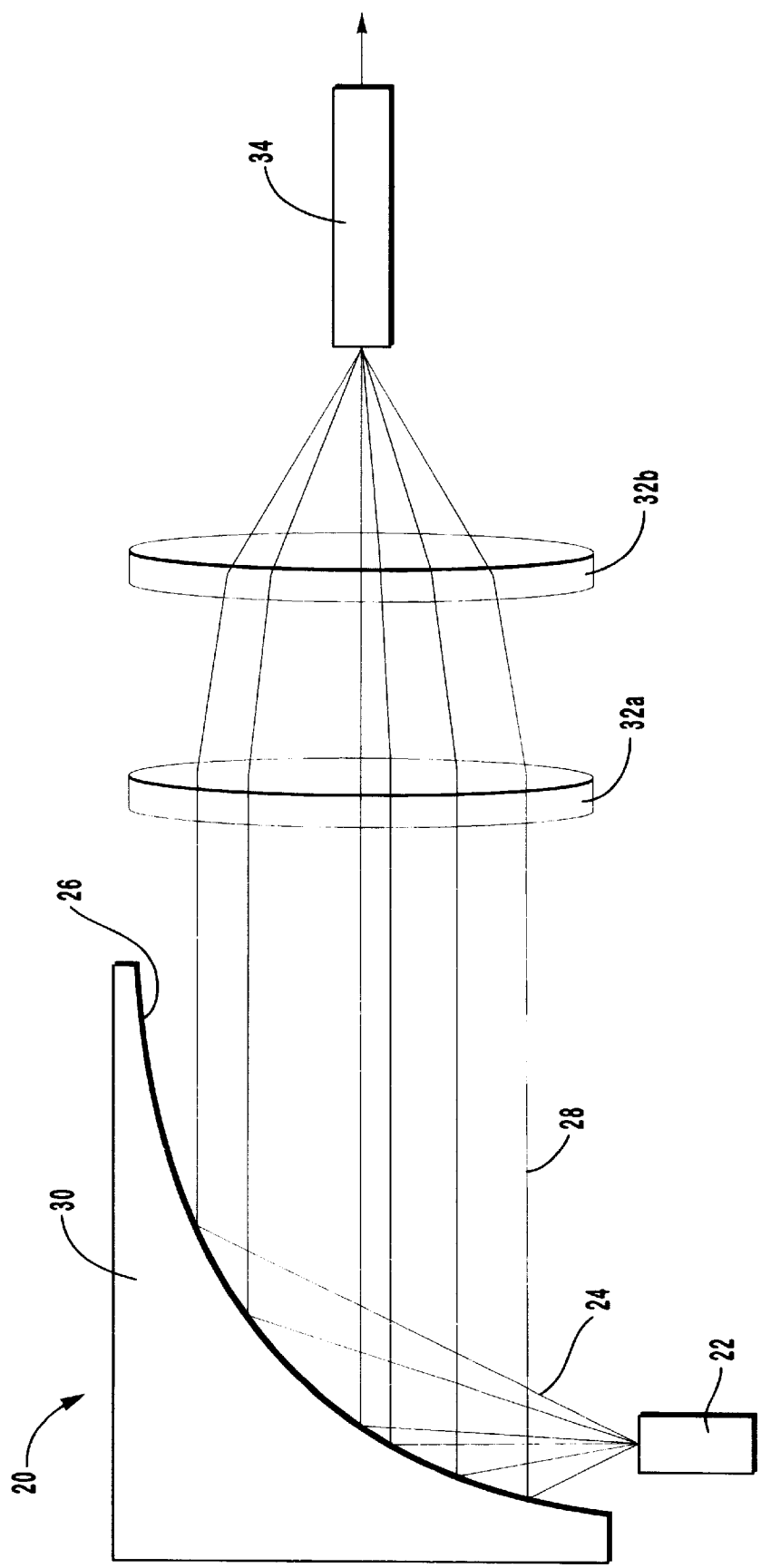
FIG. 6 is a schematic view of a further embodiment of the present invention.

In an alternate embodiment of the present invention, a broad area laser diode comprising red or infrared diode lasers is placed along the focal line of the elongated reflector, as previously described hereinabove. The divergent light from the diode laser is collimated and then is passed through a system of collimating and focusing lenses 32a and 32b as illustrated in FIG. 6. The light then passes through a non-linear crystal 34. By way of example only and not limitation, the nonlinear crystal preferably comprises lithium tantalate, potassium titanyl phosphate, or lithium niobate.

It should be appreciated that the lens configuration can be varied according to the degree of collimation required and the space available. Alternatively, a system of a plurality of conventional collimating and focusing lenses, and/or a graded-refractive index lens could be used with the apparatus of the present invention.

Figure 7:
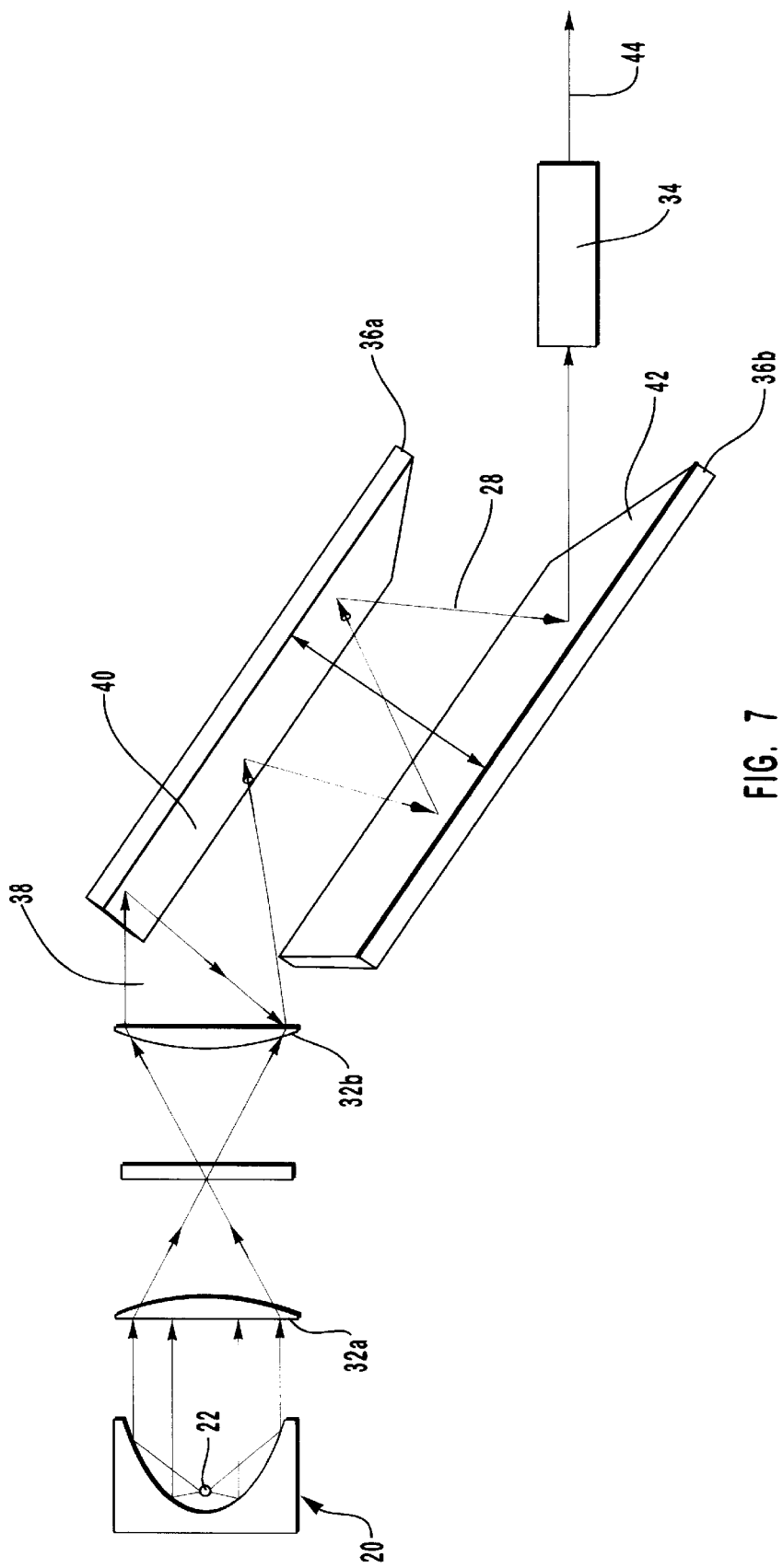
FIG. 7 is a schematic view of an alternative embodiment of the present invention.

In yet another alternate embodiment of the present invention illustrated in FIG. 7, diode laser bars are utilized in conjunction with a stripe mirror configuration. The stripe mirror configuration is positioned beyond the focusing lenses and is utilized to provide even better beam quality.

The stripe mirror configuration preferably comprises two nearly parallel mirrors 36a and 36b, which are placed at opposite sides of the central axis 38 of the focusing lenses 32a and 32b, and are separated by a small distance, as illustrated in FIG. 7. The mirrors are preferably slightly transversely offset from each other such that small sections of each mirror are not obscured by each other. The unobscured sections form the input aperture 40 and output aperture 42 for the beams 28. The mirrors further comprise reflective stripes (not shown) which are preferably placed such that they coincide with focal plane of the focusing lenses.

It will be understood by the schematic of the present invention represented in FIG. 7 that the light which is incident on the first mirror 36a upon the angle which corresponds to one of the two main lobes of the far field diffraction pattern is reflected back towards the diode laser array for optical feedback. The light which is incident upon the first mirror 36a upon the angle which corresponds to the second angle of the far field diffraction pattern is reflected towards the second mirror 36b and undergoes multiple reflections between the two mirrors. The result is a single output beam 44 at one angle, thus providing focus into one spot.

It should be appreciated that beam shaping can be accomplished by alterations in the mirror spacing and the angles of incidence of the light or of the mirrors with respect to each other. It should be also appreciated that the present invention is not limited to the focusing lens configuration illustrated in FIG. 7, but can be varied according to the degree of collimation required, the needs of the user, and the space available, for example.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An apparatus for improving the quality and power of laser beams, comprising:
   (a) an elongated reflector, said elongated reflector comprising a highly-reflective inner surface, said highly-reflective inner surface defining a hemi-parabolic curvature along the length of said elongated reflector, and said highly-reflective inner surface having a focal line corresponding to said curvature; and
   (b) a laser beam emitter, said laser beam emitter including a plurality of laser sources capable of emitting a plurality of laser beams, said laser beam emitter being positioned in relation to the focal line of said highly-reflective inner surface such that all of the laser beams from the plurality of laser sources are capable of being simultaneously emitted onto and reflected off of said highly-reflective inner surface of said elongated reflector.

2. The apparatus of claim 1, wherein said laser beam emitter comprises at least one diode laser bar.

3. The apparatus of claim 1, wherein said laser beam emitter comprises at least one red diode laser bar.

4. The apparatus of claim 1, wherein said laser beam emitter comprises at least one infrared diode laser bar.

5. The apparatus of claim 1, wherein said laser beam emitter comprises at least one broad area laser diode.

6. The apparatus of claim 1, wherein said laser beam emitter comprises at least one red broad area laser diode.

7. The apparatus of claim 1, wherein said laser beam emitter comprises at least one infrared broad area laser diode.

8. The apparatus of claim 1, further comprising an outer base, said outer base comprising a material that permits dissipation of heat generated by said plurality of laser sources.

9. The apparatus of claim 8, wherein said material comprises copper.

10. The apparatus of claim 1, wherein the laser beams are collimated upon reflection off of said highly-reflective inner surface.

11. The apparatus of claim 1, wherein the laser beams converge upon reflection off of said highly-reflective inner surface.

12. The apparatus of claim 1, wherein the laser beams diverge upon reflection off of said highly-reflective inner surface.

13. The apparatus of claim 1, wherein said highly-reflective inner surface is coated with aluminum or nickel.

14. The apparatus of claim 1, further comprising at least one lens outside of said elongated reflector in the path of the laser beams reflected off said highly-reflective inner surface.

15. The apparatus of claim 1, further comprising at least one mirror outside of said elongated reflector in the path of the laser beams reflected off said highly-reflective inner surface.

16. The apparatus of claim 1, further comprising at least one non-linear crystal outside of said elongated reflector in the path of the laser beams reflected off said highly-reflective inner surface.

17. The apparatus of claim 16, wherein said non-linear crystal comprises a material selected from the group consisting of lithium tantalate, potassium titanyl phosphate, and lithium niobate.

18. An apparatus for improving the quality and power of laser beams, comprising:
   (a) an elongated reflector, said elongated reflector comprising a highly-reflective inner surface, said highly-reflective inner surface defining a hemi-parabolic curvature along the length of said elongated reflector, and said highly-reflective inner surface having a focal line corresponding to said curvature; and
   (b) a laser beam emitter comprising at least one broad area laser diode, said laser beam emitter capable of emitting at least one laser beam, said laser beam emitter being positioned in relation to the focal line of said highly-reflective inner surface such that the laser beam is emitted onto and reflected off of said highly-reflective inner surface of said elongated reflector.

19. The apparatus of claim 18, wherein said broad area laser diode comprises a red broad area laser diode.

20. The apparatus of claim 18, wherein said broad area laser diode comprises an infrared broad area laser diode.

* * * * *

UNITED STATES PATENT AND TRADEMARK OFFICE
CERTIFICATE OF CORRECTION

PATENT NO.     : 6,219,187 B1                                   Page 1 of 1
DATED          : April 17, 2001
INVENTOR(S)    : Ruey-Jen Hwu and XuDong Wang It is certified that error appears in the above-identified patent and that said Letters Patent is hereby corrected as shown below:

<u>Title page,</u>
Item [75] Inventors, change "Ruey-Jennifer" to -- Ruey-Jen --
Item [56] OTHER PUBLICATIONS, change "Two-Mirro" to -- Two-Mirror --

<u>Column 6,</u>
Line 9, change "fill" to -- full --

<u>Column 7,</u>
Line 4, change "1am" to -- 1µm --

Signed and Sealed this

Twenty-eighth Day of May, 2002

Attest:

JAMES E. ROGAN
*Attesting Officer*      *Director of the United States Patent and Trademark Office*